US009809712B2

(12) United States Patent
Kumar et al.

(10) Patent No.: US 9,809,712 B2
(45) Date of Patent: Nov. 7, 2017

(54) HYDROPHOBIC AND OLEOPHOBIC COATINGS

(71) Applicants: Deepak Kumar, Houston, TX (US); Zhiyue Xu, Cypress, TX (US)

(72) Inventors: Deepak Kumar, Houston, TX (US); Zhiyue Xu, Cypress, TX (US)

(73) Assignee: BAKER HUGHES, a GE COMPANY, LLC, Houston, TX (US)

( * ) Notice: Subject to any disclaimer, the term of this patent is extended or adjusted under 35 U.S.C. 154(b) by 647 days.

(21) Appl. No.: 14/090,047

(22) Filed: Nov. 26, 2013

(65) Prior Publication Data
US 2015/0147523 A1 May 28, 2015

(51) Int. Cl.
*C09D 1/00* (2006.01)
*C23C 16/30* (2006.01)
*C23C 16/26* (2006.01)
*C23C 16/02* (2006.01)

(52) U.S. Cl.
CPC ............ *C09D 1/00* (2013.01); *C23C 16/0227* (2013.01); *C23C 16/0254* (2013.01); *C23C 16/26* (2013.01); *C23C 16/30* (2013.01); *Y10T 428/24355* (2015.01); *Y10T 428/30* (2015.01)

(58) Field of Classification Search
CPC ....... C09D 1/00; C23C 16/30; C23C 16/0227; C23C 16/26; C23C 16/0254; Y10T 428/30; Y10T 428/24355
USPC ........................................................ 428/141
See application file for complete search history.

(56) References Cited

U.S. PATENT DOCUMENTS

| 6,338,901 | B1 | 1/2002 | Veerasamy | |
| 6,447,891 | B1* | 9/2002 | Veerasamy | ............ B05D 5/083 |
| | | | | 428/216 |
| 2002/0032073 | A1 | 3/2002 | Rogers et al. | |
| 2002/0098285 | A1* | 7/2002 | Hakovirta | ............... C23C 16/26 |
| | | | | 427/249.7 |
| 2004/0069466 | A1* | 4/2004 | Blangetti | ................ C23C 28/00 |
| | | | | 165/133 |
| 2006/0029808 | A1 | 2/2006 | Zhai et al. | |
| 2007/0028588 | A1* | 2/2007 | Varanasi | ............... F28F 13/187 |
| | | | | 60/39.5 |
| 2008/0145631 | A1 | 6/2008 | Bhate et al. | |
| 2010/0206553 | A1 | 8/2010 | Bailey et al. | |
| 2010/0279068 | A1 | 11/2010 | Cook et al. | |

(Continued)

OTHER PUBLICATIONS

Author Unknown, Feb. 2012, "Hardness Conversion Chart", Rockwell Hardness Testers, Mitutoyo, Available Online at: http://www.mitutoyo.com/wp-content/uploads/2012/11/2059_Hardness_Tester_Conv_PG.pdf.*

(Continued)

*Primary Examiner* — Nathan Van Sell
(74) *Attorney, Agent, or Firm* — Cantor Colburn LLP

(57) ABSTRACT

A hydrophobic surface comprises a surface texture and a coating disposed on the surface texture, wherein the coating comprises an amorphous diamond like carbon material doped with 10 to 35 atomic percent of Si, O, F, or a combination comprising at least one of the foregoing, or a low surface energy material selected from fluoropolymer, silicone, ceramic, fluoropolymer composite, or a combination comprising at least one of the foregoing; and wherein the surface texture comprises a micro texture, a micro-nano texture, or a combination of a micro texture and a micro-nano texture.

20 Claims, 6 Drawing Sheets

20 μm

(56) References Cited

U.S. PATENT DOCUMENTS

| 2011/0162751 | A1* | 7/2011 | Fitzgerald | C23C 30/00 138/145 |
|---|---|---|---|---|
| 2011/0220348 | A1 | 9/2011 | Jin et al. | |
| 2013/0142994 | A1 | 6/2013 | Wang et al. | |
| 2013/0167965 | A1* | 7/2013 | Cheney | F16L 9/14 138/146 |
| 2015/0147495 | A1 | 5/2015 | Kumar et al. | |

OTHER PUBLICATIONS

Grischke et al., 1995, Elsevier, Surface Coating Technologies 74-75, 739-745, Application-oriented modifications of deposition processes for diamond-like-carbon-based coatings.*

Damasceno et al., "Deposition of Si-DLC films with high hardness, low stress, and high deposition rates", Surface and Coating Technology, vol. 133-134, Nov. 2000, pp. 247-252.

Kumar et al., "Reduction in Scale Build-up from Sub-surface Safety Valve Using Hydrophobic Material Coating", ATCE 2013, SPE Annual Technical Conference and Exhibition, Sep. 30-Oct. 2, 2013, pp. 1-25.

Kumar et al., "Reduction in Scale Build-up from Sub-surface Safety Valve Using Hydrophobic Material Coating", Society of Petroleum Engineers, 2013, pp. 1-15.

Quere et al., "Non-adhesive lotus and other hydrophobic materials", Philosophical Transactions of the Royal Society A, 366, 1539-1556 (2008).

Roy et al., "Hemocompatibility of surface modified, silicon-incporporated, diamond carbon films", Acta Biomaterilia, 5(1), 2009 p.n. 249-256.

Stojanovic et al., "Micropatterning of superhydrophobic silicone nano-filaments by a near ultraviolet Nd:YAG laser", nano Res. 3 (12), 889-894 (2010).

International Preliminary Report, International Application No. PCT/US2014/061551, dated May 31, 2016, Korean Intellectual Property Office; International Preliminary Report 12 pages.

International Search Report, International Application No. PCT/US2014/061551, dated Jan. 30, 2015, Korean Intellectual Property Office; International Search Report 6 pages.

International Written Opinion, International Application No. PCT/US2014/061551, dated Jan. 30, 2015, Korean Intellectual Property Office; International Written Opinion 11 pages.

* cited by examiner

HYDROPHOBIC AND OLEOPHOBIC COATINGS

BACKGROUND

Articles having hydrophobic and/or oleophobic surfaces have a number of commercially important features. For example, hydrophobic and/or oleophobic surfaces can stay easily clean. In addition, hydrophobic and/or oleophobic surfaces are significant in fluidics, particularly when trying to decrease flow resistance of channels. Despite all the advances in the art, there remains a need for reliable methods that are effective to produce hydrophobic and/or oleophobic surfaces in a commercial setting.

BRIEF DESCRIPTION

In an embodiment, a hydrophobic surface comprises a surface texture and a coating disposed on the surface texture, wherein the coating comprises an amorphous diamond like carbon material doped with 10 to 35 atomic percent of Si, O, F, or a combination comprising at least one of the foregoing, or a low surface energy material selected from fluoropolymer, silicone, ceramic, fluoropolymer composite, or a combination comprising at least one of the foregoing; and wherein the surface texture comprises a micro texture, a micro-nano texture, or a combination of a micro texture and a micro-nano texture.

In another embodiment, a hydrophobic surface comprises a coating disposed on an un-textured surface, wherein the coating comprises an amorphous diamond like carbon material doped with 10 to 35 atomic percent of Si, O, F, or a combination comprising at least one of the foregoing, and wherein the un-textured surface comprises a metal.

In yet another embodiment, a method of producing a hydrophobic surface comprises forming a texture on a surface of a substrate to provide a textured surface, and disposing a coating on the textured surface, wherein the coating comprises an amorphous diamond like carbon material doped with 10 to 35 atomic percent of Si, O, F, or a combination comprising at least one of the foregoing, or a low surface energy material selected from fluoropolymer, silicone, ceramic, fluoropolymer composite, or a combination comprising at least one of the foregoing; and wherein the surface texture comprises a micro texture, a micro-nano texture, or a combination of a micro texture and a micro-nano texture.

The above described and other features are exemplified by the following Figures, Detailed Description, and Examples.

BRIEF DESCRIPTION OF THE DRAWINGS

Refer now to the drawings, which are exemplary, not limiting, and wherein like elements are numbered alike.

DETAILED DESCRIPTION

Figure 1:
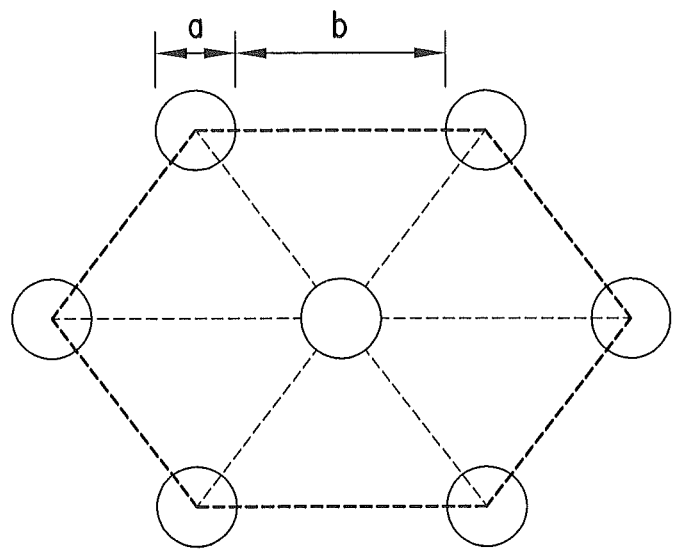
FIG. 1 is a top view of a unit cell of an exemplary surface texture.

Applicants have found that a coating comprising an amorphous diamond like carbon doped with 10 to 35 atomic percent of Si (silicon), O (oxygen), F (fluorine), or a combination comprising at least one of the foregoing can significantly increase the hydrophobicity and oleophobicity of a surface. For example, the coating increases the hydrophobicity of a steel surface by about 33% (from 70 degrees to 93 degrees).

In a further advantageous feature, the coating has excellent abrasion or wear resistance. It has a scratch hardness of greater than 100 ksi, determined according to ASTM standard D7027-05 (2009) using a micro-scratch tester. The scratch hardness is at least 1.3 times higher than that of fluoro-polymer, graphite-$MoS_2$-types of ceramic hydrophobic/oleophobic coatings typically used in the oil and gas industry. Moreover, unlike other hydrophobic/oleophobic coatings such as fluoropolymer, fluoropolymer containing composites and graphite-$MoS_2$, the coating comprising an amorphous diamond like carbon doped with 10 to 35 atomic percent of Si, O, F, or a combination comprising at least one of the foregoing has good corrosion resistance. For example, in a laboratory test the coating's chemical and mechanical properties remain intact after the aging is conducted at 300° F./1000 psi in 3% KCl brine, whereas those of fluoropolymer noticeably degraded.

The coating can be applied to a surface without any texture or a surface having micro-meter size structures or micro- and nano-meter size structures. Applicants have found that when the coating is applied to a surface having certain textures, the hydrophobicity and the oleophobicity of the coating can be greatly increased. For example, surface textures can increase the hydrophobicity of the coating by greater than 30%, greater than 40%, or even greater than 50%, as determined by comparing the contact angle of water with the coating on a surface without any texture and the contact angle of water with the same coating on a surface having textures. Further, the water and oil roll-off angles of the coating on the textured surface can also be lower as compared to the same coating applied on a surface without texture.

In addition to the coating comprising doped amorphous diamond like carbon, the hydrophobicity of a coating containing a low surface energy material can also be increased significantly when applied to a surface having certain textures. Without wishing to be bound by theory, it is believed that when a contact angle hysteresis is low, an increase in hydrophobicity/oleophobicity may lead to a better anti-scale surface, low friction surface, and anti-corrosion surface.

Accordingly, in an embodiment, the disclosure provides a hydrophobic surface comprising a surface texture and a coating disposed on the surface texture. The coating comprises an amorphous diamond like carbon material doped with 10 to 35 atomic percent of Si, O, F, or a combination comprising at least one of the foregoing, or a low surface energy material selected from fluoropolymer, silicone, ceramic, fluoropolymer composite, or a combination comprising at least one of the foregoing; and the surface texture comprises a micro texture, a micro-nano texture, or a combination of a micro texture and a micro-nano texture.

As used herein, a "hydrophobic surface" means a surface where a contact angle of a water droplet is greater than or equal to 90° C. In certain embodiments, hydrophobic surfaces may exhibit contact angles greater than 100°, greater than 110°, greater than 120° C., greater than 130° C., or even greater than 140° C.

Depending on the desired hardness to hydrophobicity or oleophobicity ratio, the amorphous diamond like carbon can be doped with 10 to 25 atomic percent or 25 to 35 atomic percent, or about 30 atomic percent of Si, O, F, or a combination comprising at least one of the foregoing. Optionally, the amorphous diamond like carbon further comprises 15 to 25 atomic percent of hydrogen atoms.

The amorphous diamond like carbon comprises 60 to 90 atomic percent of $sp^2$ bonded carbon and 10 to 40 atomic percent of $sp^3$ bonded carbon. As used herein, "$sp^2$ bonded carbon" refers to carbon atoms bonded to neighboring carbon atoms in a crystal structure substantially corresponding to the graphite isotope of carbon. "$Sp^3$ bonded carbon" refers to carbon atoms bonded to neighboring carbon atoms in a crystal structure substantially corresponding to the diamond isotope of carbon.

The dopants can be uniformly distributed in the coating or be present in a gradient. For example, an atomic concentration of Si, O, F, or a combination comprising at least one of the foregoing in the coating can decrease in a direction towards the surface texture.

In addition to doped amorphous diamond like carbon, a low surface energy material can also be coated on a textured surface described herein. Low surface energy materials include fluoropolymer, silicone, ceramic, fluoropolymer containing composite, or combinations comprising at least one of the foregoing. Fluoropolymer are materials containing multiple carbon-fluorine bonds. Examples of fluoropolymer are polytetrafluoroethylene, fluorinated ethylene propylene, perfluoroalkoxy, and polyvinylidene fluoride. The fluoropolymer composites comprise fluoropolymer and reinforcements. In an embodiment, the fluoropolymer composite is a metal-polytetrafluoroethylene composite. The low surface energy silicon can be polydimethylsiloxane. Exemplary ceramic materials include graphite/$MoS_2$ type materials. Other low surface energy materials include polyphenylene sulfide.

The substrate is not particularly limited and includes polymers, metals such as iron, chromium, nickel, titanium, cobalt, or combinations comprising at least one of the foregoing. In an embodiment, the substrate comprises steel and nickel based alloys.

The hydrophobic surface can comprises a surface texture comprising a micro texture, a micro-nano texture, or a combination of a micro texture and a micro-nano texture. As used herein, a "surface texture" refers to structures intentionally manufactured on a surface of a substrate. A "micro texture" refers to a texture having micro-meter size structural features. A "micro-nano texture" refers to a texture having nano-meter size structural features superimposed on micro-meter size structural features.

The micro and micro-nano texturing is provided in the form of periodic and/or non-periodic arrays of micro- and nano-meter size protrusions, holes, particles, pits, grooves, trenches, pillars, peaks, craters, cones, bumps, or other surface features.

Figure 2:
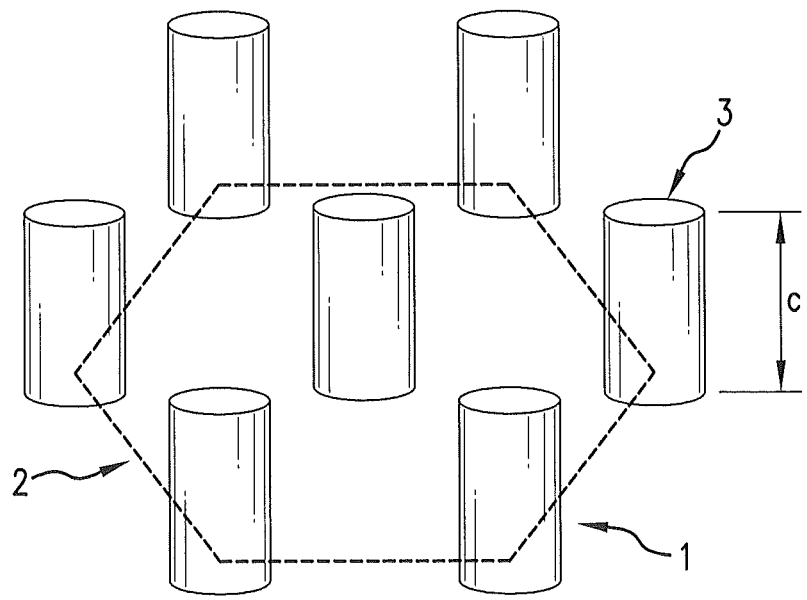
FIG. 2 is a side view of a unit cell of the exemplary texture shown in FIG. 1.

The distribution of surface feature sizes, shapes, depths, arrangement, or other properties can vary. In an embodiment, in order to increase the hydrophobicity of the coating, the surface texture has a hexagonal pattern. A unit cell of an exemplary hexagonal pattern is shown in FIGS. 1 and 2. As used herein, a "unit cell" refers to a group of structures that has the overall symmetry, and from which the entire surface texture can be built up by repetition.

In addition, the texture parameters are designed such that the following conditions are met: R>1/Cos (θ) and F<<R, where "R" is roughness factor, "F" is fraction of the surface texture, "A" is the contact angle of an un-textured or smooth surface. For amorphous diamond like carbon doped with silicon, oxygen, fluorine, or a combination comprising at least one of the foregoing, θ is about 90°-110°, and for other materials such as fluoro-polymer, silicone, fluoropolymer containing composite, θ is about 100° to about 120°.

Taking a case of surface texture being micro-meter size pillars referred as 'micro-pillar', R and F can be calculated as follows:

$$R = 1 + \frac{\text{area of the side of the micropillar lying inside the unit cell (1)}}{\text{Total area of the unit cell (enclosed by broken lines 2)}} \quad \text{(Equation 1)}$$

$$F = \frac{\text{area of the top of the micropillar inside the unit cell (3)}}{\text{Total area of the unit cell (enclosed by the broken lines 2)}} \quad \text{(Equation 2)}$$

where "a" is the diameter or width of the circular cross-section of the pillars, "b" is the spacing between pillars, and "c" is the height of the pillars.

As an example, for cylindrical micro-pillar with circular cross section, R and F can be calculated by the following equations:

$$R = 1 + \frac{2\pi ac}{\sqrt{3}(a|b)^2} \quad \text{(Equation 3)}$$

$$F = \frac{\pi a^2}{2\sqrt{3}(a+b)} \quad \text{(Equation 4)}$$

In an embodiment, the texture comprises pillars having a width ("a") of 10 μm to 60 μm, a spacing ("b") of 10 μm to 100 μm, and a height ("c") of 20 μm to 160 μm. The pillars are arranged in a hexagonal pattern. Advantageously, the pillars have a circular cross-section. Optionally, at least one pillar further comprises a nano texture on a surface of the at least one pillar. In an embodiment, R is between about 2 to about 4 and F is about 0.2 to about 0.4.

Figure 3:
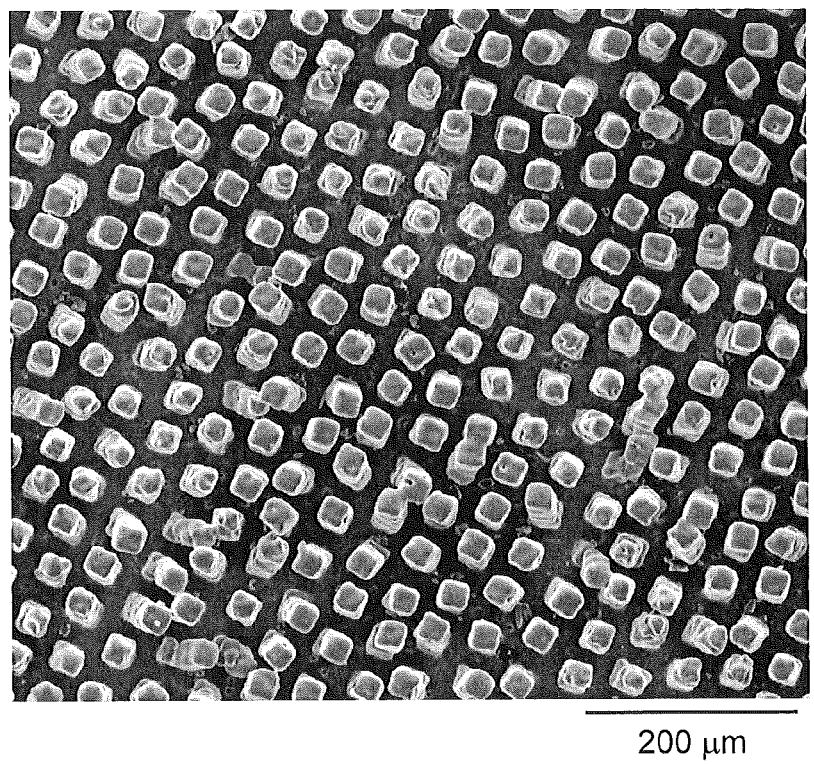
FIG. 3 is a scanning electron microscopic (SEM) image showing a top view of a 'micro-textured' surface.
Figure 4:
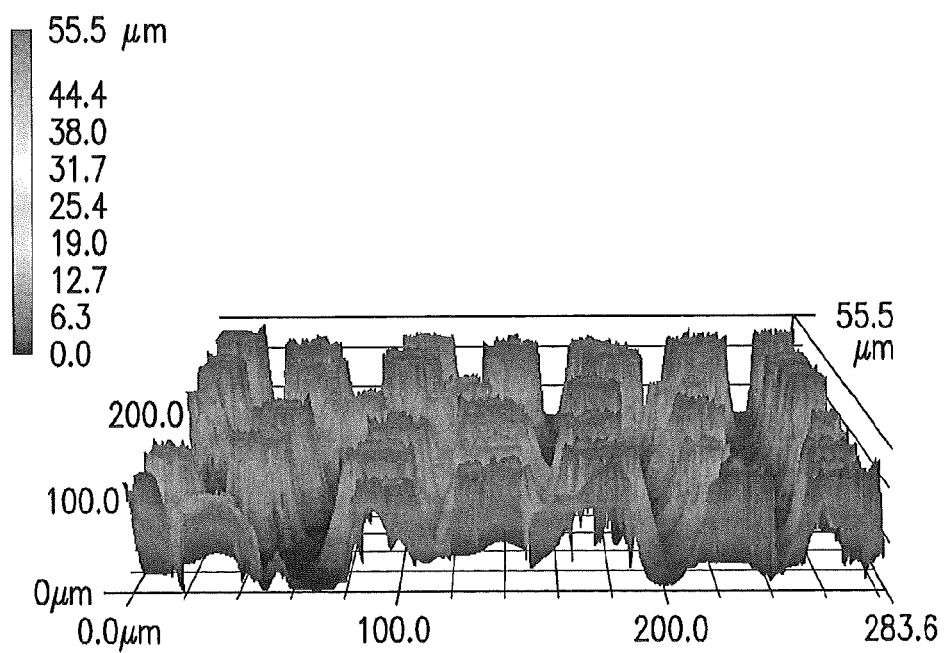
FIG. 4 is a laser-micro-scope image showing the side view of the 'micro-textured' surface of FIG. 3.

A top view and a side view of an exemplary 'micro-textured' surface are shown in FIGS. 3 and 4 respectively. Micro-pillars of diameter of 20 μm, height of 55 μm, and spacing of 40 μm are arranged in a hexagonal pattern in the entire surface.

Figure 5:
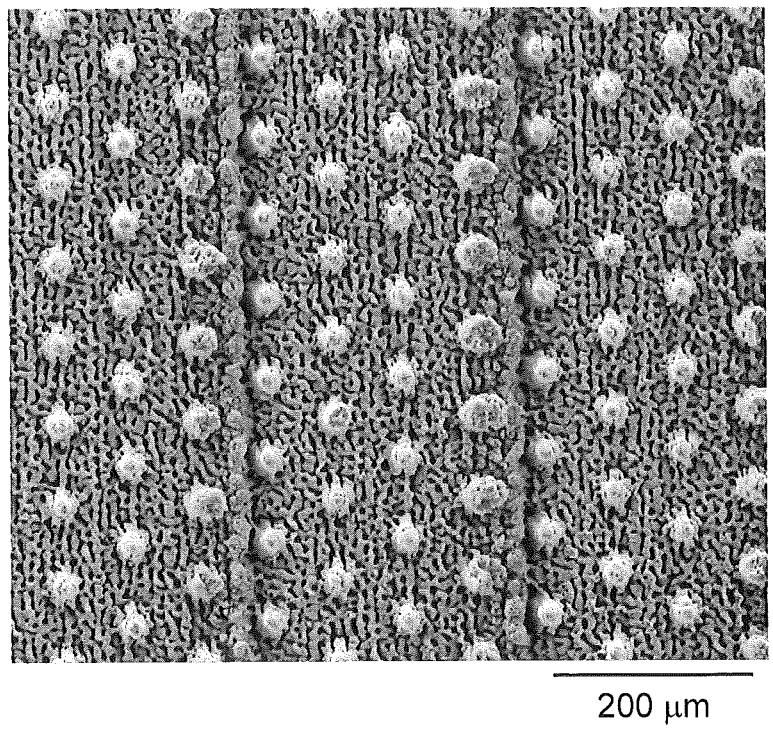
FIG. 5 is a SEM image showing a top view of a 'micro+nano textured' surface.
Figure 6:
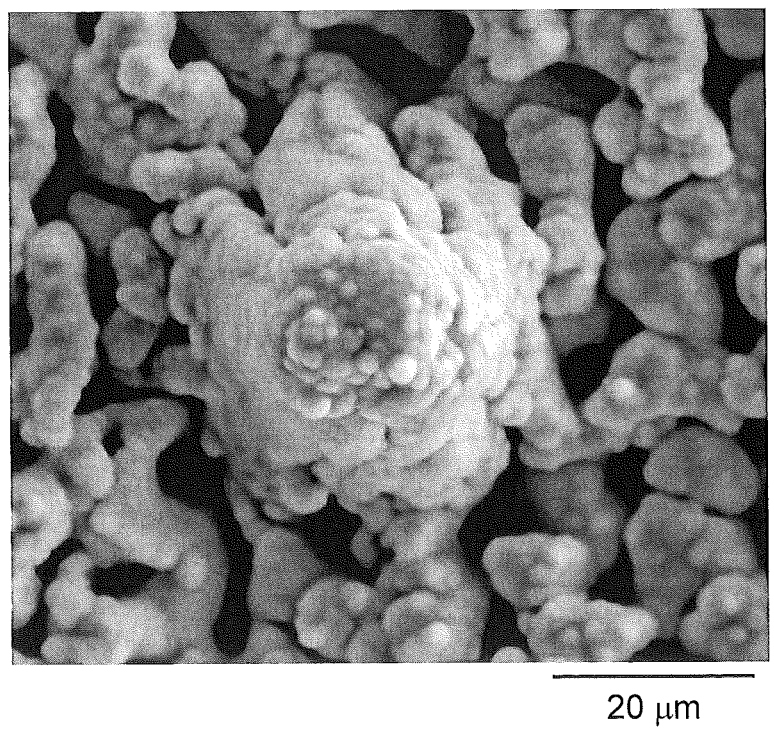
FIG. 6 is a SEM image showing the details of a micropillar in FIG. 5 at a higher magnification.

A laser-micro-scope image of 'micro+nano textured' surface is shown in FIG. 5. A SEM image of one unit of the 'micro+nano texture' surface of FIG. 5 is shown in FIG. 6. The 'micro+nano textured' surface also contains 20 μm diameter micro-pillars arranged in hexagonal pattern similar to the 'micro-textured' surface. However, in contrast to the 'micro-textured' surface where the micro-pillars are smooth, the micro-pillars in the 'micro+nano-textured' surface contain nanometer size protrusions.

In another embodiment, the amorphous diamond like carbon is coated on an un-textured surface to provide a hydrophobic surface. As used herein, an "un-textured surface" refers to a surface that does not have any intentionally manufactured surface structures. Accordingly, a hydrophobic surface comprises a coating on an un-textured surface, wherein the coating comprises an amorphous diamond like carbon material doped with 10 to 35 atomic percent of Si, O, F, or combination thereof, and wherein the un-textured surface comprises a metal iron, chromium, nickel, titanium, cobalt or combinations comprising at least one of the foregoing. In an embodiment, the substrate comprises steel and nickel based alloys.

The coating can have a thickness of 0.01 to 100 micrometers. Advantageously, the coating comprising the doped diamond like carbon has a thickness of 0.5 to 10 micrometers or 0.5 to 3 micro-meters.

Depending on the composition of the substrate, a layer of silicon, chromium, titanium, zirconium or their alloys with thickness not exceeding 0.5 micro-meter may be used between the substrate and the doped-diamond like carbon coating to facilitate better adhesion between the substrate and coating.

A method of producing a hydrophobic surface comprises forming a texture on a surface of a substrate to provide a textured surface, and disposing a coating on the textured surface.

Various methods can be used to form the surface texturing. The micro or micro-nano textures can be fabricated on a surface of a substrate by laser ablating, laser additive manufacturing, extrusion, stamping, chemical/electrochemical etching processes, sand blasting, or by depositing small particles on the surface of the substrate. The particles and the surface can comprise the same material.

In an embodiment, a micro-nano texture is formed by forming a micro texture, and then forming a nano texture on the micro texture. As a specific example, forming a nano texture comprises heating a surface comprising the micro texture to an elevated temperature under argon and oxygen. The nano texture can also be formed by chemical etching, electrical etching, or a combination thereof.

The doped amorphous diamond like carbon can be deposited on the textured surface directly. Alternatively, the textured surface can be coated with a conforming material first, and then the doped diamond like carbon is deposited on the textured surface coated with the conforming material. Conforming materials include low surface energy materials described herein. For example, conforming materials include fluoropolymer, silicone, metal-fluoropolymer composites, or a combination comprising at least one of the foregoing.

The doped amorphous diamond like carbon can be deposited on a surface of a substrate by vapor deposition. A "vapor deposition" process refers to a process of depositing materials on a substrate through the vapor phase. Vapor deposition processes include physical vapor deposition, chemical vapor deposition, and plasma-assisted vapor deposition. Different variations of physical deposition, chemical deposition, and plasma-assisted vapor deposition can be used. Exemplary deposition processes can include plasma assisted chemical vapor deposition, sputtering, ion beam deposition, laser ablation, or thermal evaporation. In an embodiment, the doped amorphous diamond like carbon is deposited by plasma ion immersion implantation and deposition.

The gaseous medium for the vapor deposition can be 100% hexamethyldisiloxane or a mixture of tetramethylsilane and $C_2H_2$ gases for Si or a combination of Si and O doped amorphous diamond like carbon. For fluorine doped amorphous diamond like carbon, the gaseous medium is a mixture of $C_2H_2$ and $C_2F_4$ gases.

The low surface energy material can be applied to the textured surface by any method known in the art, for example, by spray coating, dip-coating, thermal evaporation coating, or electrolytic or electroless coating techniques.

In another embodiment, the doped amorphous diamond like carbon or the low surface energy material is deposited on an un-textured surface first to provide a coating. Next, a micro texture, a micro-nano texture, or a combination of a micro texture and a micro-nano texture is formed on the coating.

Figure 7:
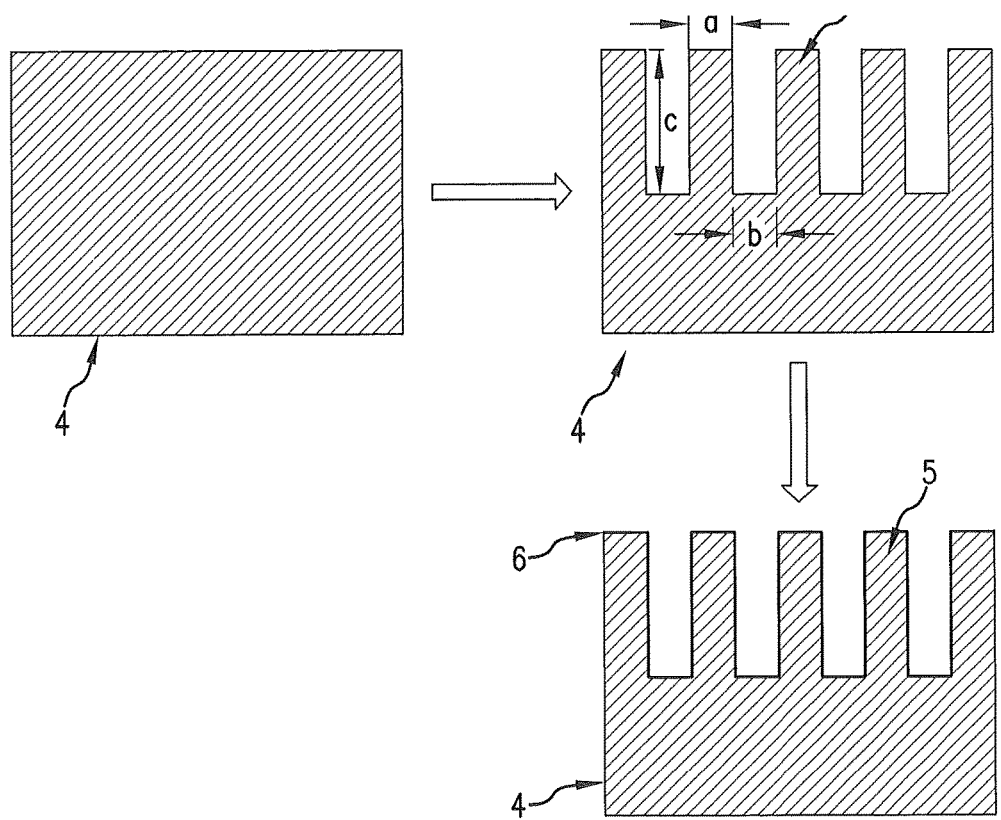
FIG. 7 is a diagram illustrating an exemplary embodiment of a method to coat a substrate.
Figure 8:
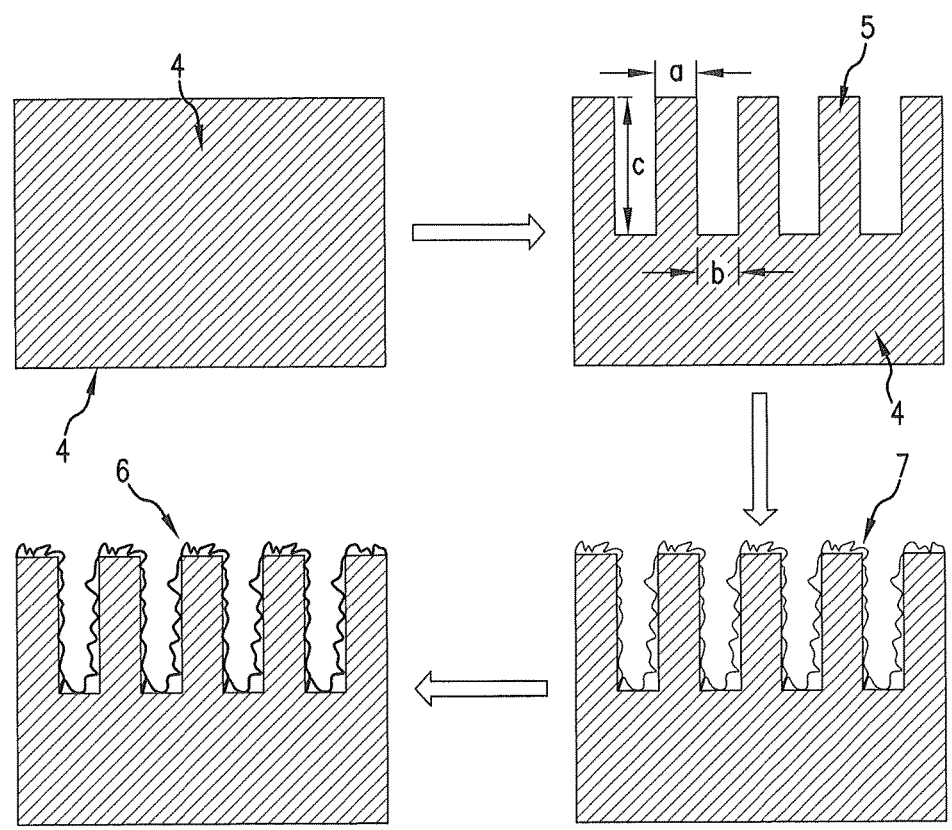
FIG. 8 is a diagram illustrating another exemplary embodiment of a method to coat a substrate.

Exemplary embodiments of the processes to produce a hydrophobic surface are illustrated in FIGS. 7 and 8. Referring initially to FIG. 7, a surface of work-piece 4 is patterned by forming a plurality of micro-pillars 5. A low surface energy material or amorphous diamond like carbon is then applied to or deposited on the texture forming coating 6.

Referring to FIG. 8, after forming micro-pillars 5 on the surface of work-piece 4, nano-texturing 7 is formed on the micro-pillars 5 providing a micro-nano texture. A low surface energy material or a doped diamond like carbon is then applied to or deposited on the micro-nano texture forming coating 6.

The coating can be applied to internal, external, or both the internal and the external surfaces of articles such as the inner wall tube, pipe, safety valve, or flow control valves as an anti-scale, anti-deposition, low-friction, and/or anti-corrosion coating.

In an embodiment, an article comprises the hydrophobic surface described herein. The article include electric submersible pump (ESP) flow intake sub, slips, debris barrier, multilateral window, particle in mud cake, liner setting sleeves, timing actuation device, encapsulation of chemicals, screen protector, beaded screen protector, screen basepipe, inflow control device, flapper, emergency release tools, mandrels, parts for mold release, tag release, flapper held in place, float shoes, staging collars, darts, shifting/setting balls, store energy sources, gas lift valve, fluid loss control flappers, or body locking ring. In an embodiment, the coated article is a downhole safety valve, a flow control valve, a production tubing, or a gas-lift mandrel.

Hydrophobic coatings are further illustrated by the following non-limiting examples.

EXAMPLES

Three coatings were prepared. For the first coating, amorphous silicon doped diamond like carbon was deposited on an un-textured steel surface via plasma ion immersion deposition at 300° F. The amorphous coating was a mixture of $sp^2$ graphite and $sp^3$ diamond bonding containing C, Si and O atoms. X-ray photoelectron spectroscopy (XPS) analysis revealed that the total amount of Si in the coating was approximately 30%, most of which was present in the form of a mixture of oxides (SiOx) and carbides (SiCx).

Same amorphous silicon doped diamond like carbon was also deposited on a micro-textured surface shown in FIGS. 3 and 4 and a micro-nano-textured surface shown in FIGS. 5 and 6 to form coating 2 and coating 3.

Hydrophobicity, or contact angle of water with a solid surface, was measured using a DSA* 20 instrument from Kruss Inc. A small volume, 5 μl, of water was first pipetted out onto the test-piece using a micro-syringe. The image of the droplet resting on the surface was recorded using a digital camera. The contact angle was measured at the triple junction of the solid, water droplet, and air using image-analysis software provided with the DSA* 20.

Figure 9:
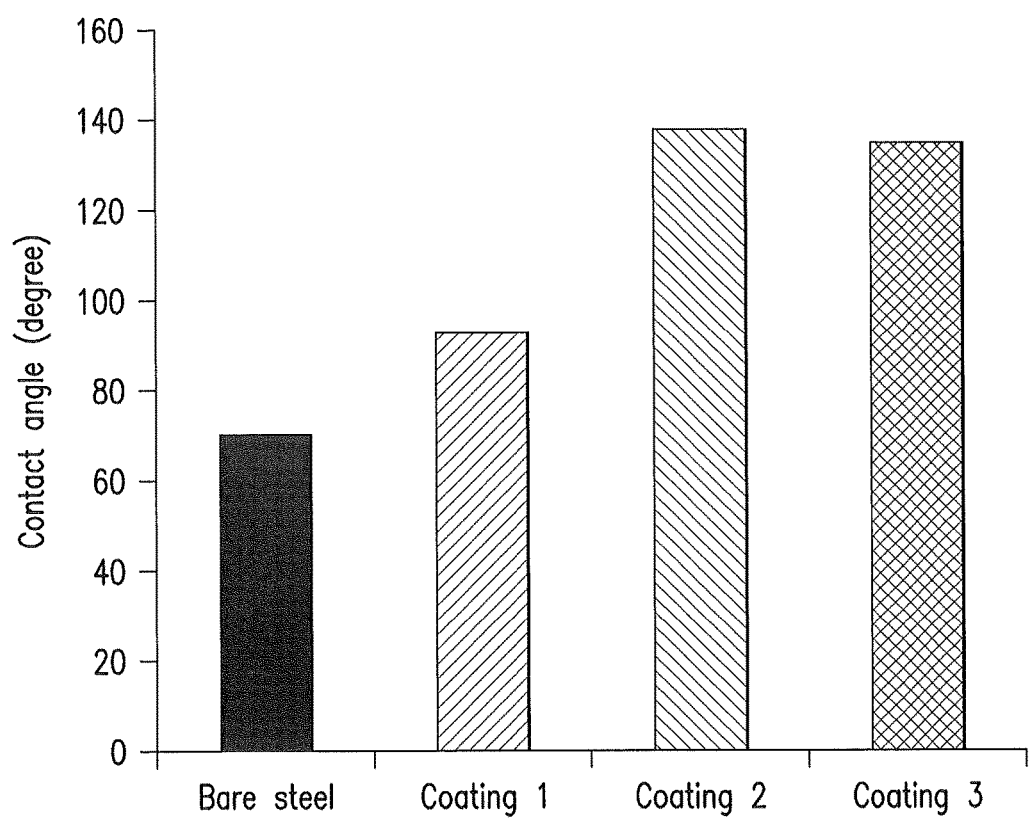
FIG. 9 is a graph showing contact angle (degree) of coated and uncoated substrates.

FIG. 9 compares the contact angle of water with coatings 1-3. The amorphous diamond like carbon coating disposed on an un-textured surface was moderately hydrophobic with a contact angle of 93° C. However, the contact angle for the same coating on the textured surfaces increased to about 135 and about 138 (coatings 2 and 3).

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A hydrophobic surface comprising a surface texture and a coating disposed on the surface texture, wherein the coating comprises a first layer disposed directly on the surface texture and a second layer disposed on the first layer, the first layer comprising a conforming material and the second layer comprising an amorphous diamond like carbon material doped with 25 to 35 atomic percent of a dopant comprising a combination of Si and O or a combination of Si, O, and F, the diamond like carbon material comprising 60 to 90 atomic percent of $sp^2$ bonded carbon and 10 to 40 atomic percent of $sp^3$ bonded carbon; and the conforming material comprising polytetrafluoroethylene, fluorinated ethylene propylene, perfluoroalkoxy, polyvinylidene fluoride, polydimethylsiloxane, polyphenylene sulfide, metal-polytetrafluoroethylene composites, or a combination comprising at least one of the foregoing; and wherein the surface texture comprises a micro texture, a micro-nano texture, or a combination of a micro texture and a micro-nano texture; and the coating has a scratch hardness of greater than 100 ksi, determined according to ASTM standard D7027-05 (2009) using a micro-scratch tester.

2. The hydrophobic surface of claim 1, wherein the diamond like carbon material further comprises 15 to 25 atomic percent of hydrogen atoms.

3. The hydrophobic surface of claim 1, wherein an atomic concentration of the dopant in the coating decreases in a direction from the coating towards the surface texture.

4. The hydrophobic surface of claim 1, wherein the texture has a hexagonal pattern.

5. The hydrophobic surface of claim 4, wherein the texture comprises pillars having a circular cross-section with a height (c) of 20 μm to 160 μm, a width (a) of 10 μm to 60 μm, and a spacing (b) of 10 μm to 100 μm.

6. The hydrophobic surface of claim 5, wherein the width (a), spacing (b), and height (c) are selected based on the equation $$R = 1 + \frac{2\pi ac}{\sqrt{3}\,(a+b)^2},$$

wherein R is between 2 and 4.

7. The hydrophobic surface of claim 5, wherein at least one pillar further comprises a nano texture on a surface of the at least one pillar.

8. The hydrophobic surface of claim 1, wherein the contact angle of the coating is increased by at least 30% as compared to the same coating disposed on a surface without the texture.

9. The hydrophobic surface of claim 1, wherein the substrate comprises a metal.

10. The hydrophobic surface of claim 1, wherein the coating has a thickness of 0.01 to 100 microns.

11. A hydrophobic surface comprising a coating disposed on an un-textured surface, wherein the coating comprises a first layer disposed directly on the un-textured surface and a second layer disposed on the first layer, the first layer comprising a conforming material and the second layer comprising an amorphous diamond like carbon material doped with 25 to 35 atomic percent of a dopant comprising a combination of Si and O, or a combination of Si, O, and F, the diamond like carbon material comprising 60 to 90 atomic percent of $sp^2$ bonded carbon and 10 to 40 atomic percent of $sp^3$ bonded carbon and wherein the un-textured surface comprises a metal; and the conforming material comprising polytetrafluoroethylene, fluorinated ethylene propylene, perfluoroalkoxy, polyvinylidene fluoride, polydimethylsiloxane, polyphenylene sulfide, metal-polytetrafluoroethylene composites, or a combination comprising at least one of the foregoing; and the coating has a scratch hardness of greater than 100 ksi, determined according to ASTM standard D7027-05 (2009) using a micro-scratch tester.

12. The hydrophobic surface of claim 11, wherein the diamond like carbon material further comprises 15 to 25 atomic percent of hydrogen atoms.

13. The hydrophobic surface of claim 12, wherein an atomic concentration of the dopant decreases in a direction from the coating towards the un-textured surface.

14. A method of producing a hydrophobic surface, the method comprising forming a texture on a surface of a substrate to provide a textured surface, forming a coating on the textured surface, wherein the coating comprises a first layer disposed directly on the surface texture and a second layer disposed on the first layer, the first layer comprising a conforming material and the second layer comprising an amorphous diamond like carbon material doped with 25 to 35 atomic percent of a dopant comprising a combination of Si and O, or a combination of Si, O, and F, the diamond like carbon material comprising 60 to 90 atomic percent of sp2 bonded carbon and 10 to 40 atomic percent of sp3 bonded carbon; the conforming material comprising polytetrafluoroethylene, fluorinated ethylene propylene, perfluoroalkoxy, polyvinylidene fluoride, polydimethylsiloxane, polyphenylene sulfide, metal-polytetrafluoroethylene composites, or a combination comprising at least one of the foregoing.

15. The method of claim 14, wherein the second layer is disposed on the first layer via physical vapor deposition, chemical vapor deposition, and plasma-assisted vapor deposition.

16. The method of claim 14, wherein the second layer is disposed on the first layer via plasma ion immersion implantation and deposition.

17. The method of claim 14, wherein forming the texture comprises laser ablating, sand blasting, laser additive manufacturing, extrusion, stamping, chemical etching, electrochemical etching, or depositing small particles on the surface of the substrate.

18. The method of claim 14, wherein forming a texture comprises forming a micro texture, and forming a nano texture on the micro texture.

19. The method of claim 18, wherein forming a nano texture comprises heating the substrate comprising the micro structure to an elevated temperature under argon and oxygen.

20. The method of claim 18, wherein forming a nano texture comprises chemical etching, electrical etching, or a combination thereof.

* * * * *